United States Patent [19]

de Ronde

[11] 4,049,902

[45] Sept. 20, 1977

[54] CONNECTOR FOR COAXIAL CABLES

[75] Inventor: Henry Marinus de Ronde, Lomita, Calif.

[73] Assignee: Hughes Aircraft Company, Culver City, Calif.

[21] Appl. No.: 634,471

[22] Filed: Nov. 24, 1975

[51] Int. Cl.[2] .......................... H01R 5/04; H05K 9/00

[52] U.S. Cl. .................................... 174/35 C; 174/87; 339/177 R

[58] Field of Search ................. 174/35 C, 71 C, 75 C, 174/87; 333/33, 97 R; 339/126 J, 136 R, 136 C, 139 R, 139 C, 143 R, 143 C, 177 R, 177 E

[56] References Cited

U.S. PATENT DOCUMENTS 3,480,722 11/1969 Van Horssen et al. ................ 174/87

*Primary Examiner*—Laramie E. Askin

*Attorney, Agent, or Firm*—Lindenberg, Freilich, Wasserman, Rosen & Fernandez

[57] ABSTRACT

An RF connector for coaxial cables to be interconnected through a conductive wall. A cylindrical housing open at one end is closed at the other by a base having a centered aperture to receive just the inner conductor and insulation of one cable, and having a concentric extension of the base of an internal diameter just sufficient to receive the outer conductor of the cable. The stripped end of a second cable is inserted through a slot in the side of the housing with the outer conductor resting on an annular shoulder and the inner conductor looped and soldered around the inner conductor of the first cable. A slotted sleeve inserted into the housing holds the outer conductor of the second cable clamped against the shoulder. A threaded cap screws into the housing over the sleeve to hold the sleeve in a clamping position.

9 Claims, 4 Drawing Figures

CONNECTOR FOR COAXIAL CABLES

BACKGROUND OF THE INVENTION

This invention relates to a connector for interconnecting small coaxial cables, and more particularly for interconnecting small coaxial cables between integrated circuit modules, or hybrid modules, through a conductive wall.

Great advances have been made in the field of micro-electronics. Electronic components have been drastically reduced in size allowing for smaller and smaller functional circuits, such as integrated circuits (IC's) and circuits of hybrid ceramic substrates. A large number of these circuits are used in units operating at Radio Frequencies (R.F.).

The interconnections between R.F. units are accomplished with semi-rigid coaxial cables and R.F. connectors. The trend has been to reduce size of the connectors.

The coaxial cable diameter has been reduced in size also. Coaxial cables with 0.25 and 0.141 inch diameter were commonly used in the past. Today, coaxial cables with diameters of 0.085, 0.070, 0.045, 0.034 and 0.020 inch are commercially available.

However, the R.F. connectors have not kept pace with the reduction in size of electronic components and cables. Thus, there is no R.F. connector in existence which can be mounted on a micro-electronic unit which will accept 0.070, 0.045, 0.034 and 0.020 inch diameter coaxial cable. The use of large and heavy R.F. connectors and coaxial cables largely defeats the purpose of using micro-electronics, i.e., using electronic components of small size and weight.

The object of this invention is therefore to provide an R.F. connector for small coaxial cables which is reliable even in severe environmental conditions created by vibration, shock, temperature and humidity. Since the connector is to be very small, another object is to provide a simple structure to assemble upon installation of the connector and interconnected coaxial cables.

SUMMARY OF THE INVENTION

These and other objects of the invention are achieved by a connector for connecting coaxial cables through a hole in a conductive wall comprising a housing having a cylindrical body portion and a planar base portion of greater diameter than the body portion. The base portion has an aperture of a diameter just sufficient to receive only the internal conductor and insulation of a first coaxial cable. A concentric tubular extension of the base portion has an internal diameter just sufficient to receive the outer conductor of a coaxial cable. The cylindrical body has an internal annular shoulder near the base portion adapted to space a sleeve above the base portion. The length of the sleeve is less than the depth of the shoulder in the body portion by an amount sufficient to permit a threaded cap to be screwed into the internally threaded open end of the body portion. The body portion has a slot rounded at one end with a radius sufficient to receive just the outer conductor of a second coaxial cable resting on the shoulder of the body portion. The other end of the slot may be open ended. The sleeve has an open ended slot rounded at its closed end with a radius substantially equal to the radius of the rounded end of the body slot. With a second coaxial cable in place in the body slot, and a sleeve in place over the second cable with its slot over the outer conductor of the second cable, the cap is screwed in until the sleeve sits on the shoulder.

The length of the slot in the sleeve is preferably less than the outer diameter of the second cable by a small amount so that the seated sleeve crimps the outer conductor, thus locking the second cable in place. The outer conductor and insulation are stripped back to almost the annular shoulder to expose the inner conductor preferably formed into a loop around the inner conductor of the first cable protruding into the housing through the aperture of the base portion. Solder completes the electrical connection between the two inner conductors. The internal configuration of the body portion is designed to maintain a predetermined impedance similar to the impedance of the coaxial cables to be interconnected. The body and base portions, and the extension of the base portion, are made of conductive material to provide electrical continuity between the outer conductor of the first cable and the outer conductor of the second cable. Solder around the end of the extension of the base portion assures good electrical connection between the outer conductor of the second cable and the body portion of the connector. The base portion which extends beyond the body portion prevents the connector from being pulled through the hole in the conductive wall. Solder between the base portion and the conductive wall connects the connector, and therefore the outer conductors of the cables, to the potential of the wall. Both cables are preferably of the same outer diameter of their outer conductors, but that is not a limitation of the invention since obviously the first conductor may be of a different diameter than the second. Although solder has been expressly referred to, it is to be understood that for the purpose of this invention, the term "solder" includes silver or any conductive epoxy which may replace any solder for any connection or mounting purposes.

The novel features that are considered characteristic of this invention are set forth with particularity in the appended claims. The invention will best be understood from the following description when read in connection with the accompanying drawings.

DESCRIPTION OF THE PREFERRED EMBODIMENTS

Figure 1:
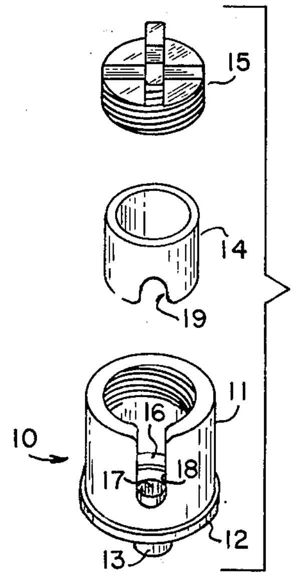
FIG. 1 is an exploded view showing a three-part connector according to the present invention.

Referring to FIG. 1, the three parts of a connector made according to the present invention are: a connector housing 10 having a cylindrical body portion 11, a base portion 12, and a tubular extension 13; a sleeve 14 which fits inside the body portion; and a threaded cap 15 which screws into the body portion to secure the sleeve inside the body portion against an annular shoulder 16 in the body portion. A centered aperture 17 in the base portion 12 is of just sufficient diameter to receive the insulation and center conductor of a first coaxial cable. The tubular extension 13 has an internal diameter just large enough to receive the outer conductor of the coaxial cable. All parts are preferably made of brass and gold plated.

The body portion 11 has a slot 18 on one side. The slot is rounded at one end with a radius just sufficient to receive the outer conductor of a second coaxial cable, with the coaxial cable resting on the shoulder 16 inside the body portion. For example, for a cable having an outer conductor diameter of 0.034 inch (outside diameter), the slot has a width of from 0.032 to 0.034 inch, with a full radius of half that width. The upper end of the slot is open, and the corners of the open end are rounded to facilitate placing a coaxial cable in the slot. The sleeve 14 is also provided with an open slot 19 of a width and depth just sufficient to fit over a cable in the slot 18. For example, for the 0.034-cable, the slot 19 will have a width of 0.034 ± 0.001 inch, and a depth of from 0.032 to 0.034 inch. After a cable is inserted in the slot 18, the sleeve is inserted into the body portion with the slot 19 placed over the cable. Then when the cap 15 is screwed into place, the cable is crimped and secured in place by the sleeve.

Before the connector is assembled as just described with a cable in the slot 18, a first coaxial cable is prepared for insertion into the tubular extension 13 by stripping off the outer conductor for a length equal to the distance from outside the base portion 12 to about the center of the body portion 11. The insulation is then stripped for nearly that length. The coaxial cable thus prepared is then inserted into the tubular section 13 and body portion 11 with the edge of the outer conductor against the base portion, and the insulated inner conductor protruding through the base portion with the bare inner conductor extending into the center of the body portion to a point just above the radial center of the slot 18. The second coaxial cable is then prepared by stripping the outer conductor a length about equal to the inner diameter of the annular shoulder, and stripping the insulation to very near the same length. The bare inner conductor of the second coaxial cable is then bent into a loop. As the second coaxial cable is placed in the slot 18, the loop is placed over the end of the inner conductor of the first coaxial cable inserted through the extension 13. The loop is then soldered to the end of the inner conductor thus looped using regular solder (melting temperature approximately 460° F). Once that is done, the outer conductor of the first coaxial cable is soldered to the tubular extension 13 using low temperature solder (below 400° melting temperature). After the sleeve 14 is inserted, the cap 15 is screwed in until it is tight.

Figure 4:
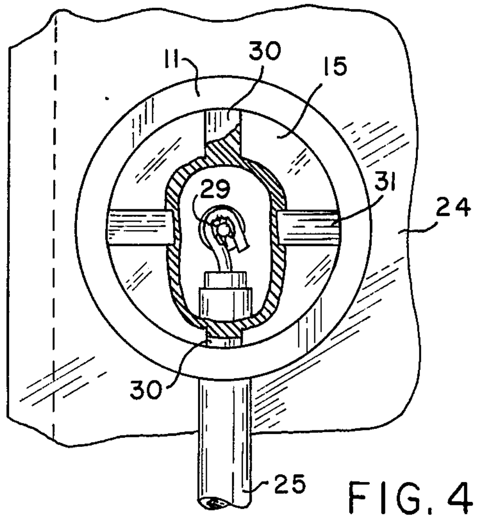
FIG. 4 is a plan view of the assembled connector shown in FIG. 2.
Figure 2:
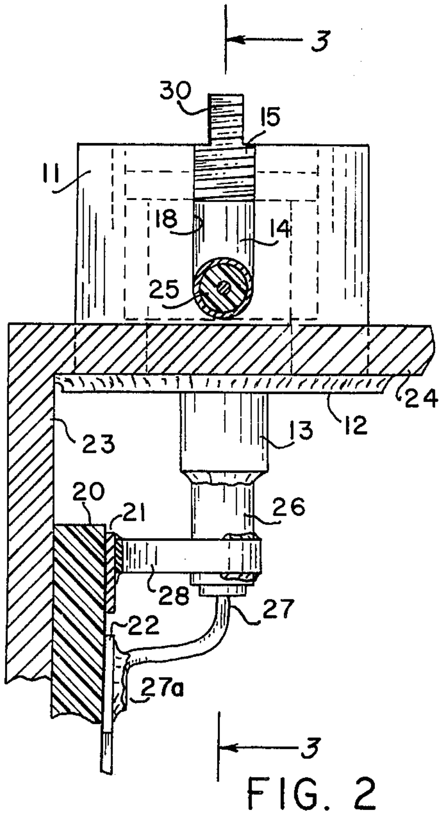
FIG. 2 is a side view in elevation of the connector of FIG. 1 assembled for connection of a first coaxial cable to a second coaxial cable through a conductive wall.
Figure 3:
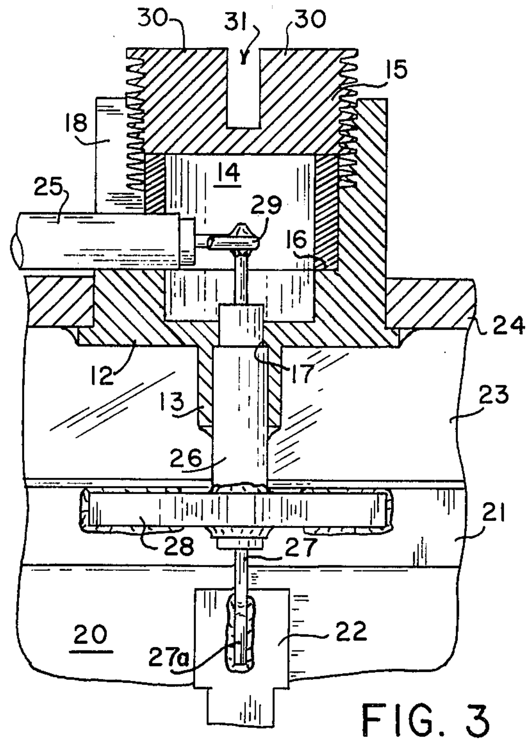
FIG. 3 is a sectional view of the assembled connector of FIG. 1 taken along the line 3—3 of FIG. 2.

An exemplary manner in which the connector of FIG. 1 is used to connect two coaxial cables through a conductive wall will now be described with reference to FIGS. 2, 3 and 4. A substrate 20 having a peripheral ground plane 21 is employed to support and interconnect a plurality of integrated circuits (not shown) through printed circuit connectors. At least one external connection is required to be made through a connecting pad 22. The entire substrate is surrounded by conductive walls only two of which are shown, namely a support wall 23 and a side wall 24. The support wall may be a tray having a plurality of rectangular areas separated by side walls, each area having its own substrate and integrated circuits forming a functional module. The functional modules are connected as necessary with coaxial cables passing through the side walls. When a number of trays are stacked, the support wall serves as a cover for the compartments of the tray below. The top tray is then covered by a plate of conductive material. Interconnections between trays are then made by coaxial cables through outside walls using the connector of FIG. 1. The technique for doing that will now be described.

The body portion 10 of a connector is first inserted into a hole in the side wall 24. The base portion 12 is of greater diameter than the body portion so that the body portion will not fall out once inserted into the hole from the inside of the wall 24. The base portion is then soldered to the wall 24 using a regular type solder (melting temperature approximately 460° F). But first the cylindrical body portion is rotated to place the slot 18 in the position desired for the second coaxial cable 25, or in a position required to receive the second coaxial cable.

A section of coaxial cable is stripped at one end and inserted into the connector body portion as the first coaxial cable 26. Before actually inserting it, the other end of the cable 26 is similarly stripped by removing the outer conductor for a certain length and the insulation for a slightly shorter length. Once the cable 26 is inserted into the body portion, the outer conductor of the cable 26 is soldered to the extension 13 with low temperature solder (melting temperature below 400° F). The stripped inner conductor 27 is bent down at end *27a* to reach the connecting pad 22 where it is soldered in the usual manner.

A thin copper ribbon 28 is draped over the outer conductor of the first coaxial cable 26 with both ends of the ribbon on the ground plane 21. The ribbon is then soldered to the ground plane and the outer conductor. This assures continuity from the ground plane to the connector and wall 24 through the outer conductor of the coaxial cable. All connections inside the wall 24 are now complete, and the inside may be closed as by stacking another tray on the side walls or placing a cover over the side walls.

Connection of the inner conductor of the coaxial cable 25 to the inner conductor 27 of the coaxial cable 26 is made inside the cylindrical body portion 11 of the connector during final assembly after all tests necessary to be made through the inner conductor 27 have been completed. A precut length of the coaxial cable 25 is prepared at one end to be inserted into the connector by stripping the outer conductor a predetermined length and stripping the insulation to almost the same length, and forming a loop 29 to fit around the inner conductor of the cable 26 as shown in FIGS. 3 and 4. The loop is then soldered to the inner conductor of the cable 26. Then the sleeve 14 is placed inside the body portion 11 with its slot over the coaxial cable 25. Finally the cap is screwed in tight, thus crimping the outer conductor of the coaxial cable 25 between the shoulder 16 and the slot 19 in the sleeve 14. That insures a good electrical connection between the outer conductor of the cable 25 and the body of the connector.

Although this connector configuration may be used for many applications, and with coaxial cables of all sizes, it is used to greatest advantage in hybrid integrated circuit applications with 0.034 inch diameter cable. The diameter and length of the body portion 11 for such a small coaxial cable are 0.180 and 0.145 inch respectively. The cap 15 is therefore very small. Consequently, the cap is provided with small tabs 30 which may be grasped with tweezers to pick up the cap and insert it into the threaded body portion 11 while giving the cap a slight twist to engage the threads. Once the threads are engaged, a small screw driver may be inserted into a slot 31 to tighten the cap down on the sleeve.

Although a particular embodiment of the invention has been described and illustrated herein, it is recognized that modifications and equivalents may readily occur to those skilled in the art. Consequently it is intended that the claims be interpreted to cover such modifications and equivalents.

What is claimed is:

1. An assembly of a coaxial cable connector and two coaxial cables for providing a shielded connection of one of said coaxial cables to the other of said coaxial cables, each cable having an inner conductor separated from an outer conductor by a sheath of insulation, said connector comprising a housing of conductive material having a cylindrical body portion and a planar base portion closing off one end of said body portion, the opposite open end being internally threaded, and said base portion having an aperture of a diameter just sufficient to receive only the internal conductor and insulation of said one coaxial cable, the internal conductor and insulation of said one coaxial cable being received in said aperture, said base portion further having a tubular extension concentric with said aperture, said extension having an internal diameter just sufficient to receive the outer conductor of said one coaxial cable, said outer conductor of said one coaxial cable being received in said extension, said cylindrical body portion having an annular shoulder near the base portion and further having a slot rounded at one end with a radius just sufficient to receive said other coaxial cable with its outer conductor intact and resting on said shoulder, said other coaxial cable being received in said slot with the outer conductor thereof resting on said shoulder, a sleeve of conductive material having an external diameter just sufficient to insert it into said cylindrical body portion over said shoulder, said sleeve being inserted into said cylindrical body portion over said shoulder, said sleeve having an open ended slot rounded at its closed end with a radius substantially equal to the radius of the rounded end of said slot in said body portion, said sleeve fitted over said other coaxial cable, and a threaded cap of conductive material screwed into the threaded end of said body portion until said sleeve seats on said shoulder of said body portion, thereby holding in place said other coaxial cable.

2. An assembly as defined in claim 1, and further including a wall having a hole therethrough and wherein said base portion of said housing is of greater diameter than said body portion and is inserted into said hole in said wall with the circumferential end of said base portion against said wall.

3. An assembly as defined in claim 1 and further including a wall, said wall being made of conductive material, and including conductive means securing said connector base portion to said wall with electrical continuity from said connector housing to said wall.

4. An assembly as defined in claim 3 wherein said one coaxial cable is stripped of its outer conductor a predetermined length and the inner conductor thereof extends into said body portion beyond said shoulder by slightly less than the diameter of said other coaxial cable, and wherein said one coaxial cable is stripped of insulation at its end, thereby exposing said inner conductor, the inner conductor of said other coaxial cable having its end stripped of its outer conductor and insulation, and the inner conductors of the two coaxial cables being connected together.

5. An assembly as defined in claim 4 wherein said inner conductor of said other coaxial cable stripped of outer conductor and insulation is looped around said inner conductor of said one coaxial cable, and including solder between said loop and said inner conductor of said one coaxial cable.

6. An assembly as defined in claim 5 wherein said slot in said body portion is open at its end remote from said shoulder to facilitate placing said other coaxial cable in said slot with the loop thereof around said inner conductor of said one coaxial cable.

7. An assembly as defined in claim 1 wherein said cap is provided with a slot adapted to receive a tool for screwing the cap on, and at least one tab adapted for holding said cap with a tweezer-like tool while the cap is put in place and its threads engaged with internal threads of said body portion.

8. Parts for forming an RF connector for connecting two coaxial cables, each cable having an external diameter of about 0.034 inch comprising a cylindrical housing and threaded cap, said housing being open at one end and closed at the other by a base having a centered aperture of a diameter just sufficient to receive the inner conductor and insulation of one cable, said open end being internally threaded to receive said threaded cap, and said housing having a concentric extension of said base of an internal diameter just sufficient to receive the outer conductor of said one cable, said housing having an internal annular shoulder on said base and a slot through the side of the housing, said slot being longitudinally disposed and rounded at one end with a radius just half the diameter of the outer conductor of said other cable, said shoulder being tangent to said rounded end of said slot, whereby said other cable may be inserted into said housing with its outer conductor resting on said shoulder, and a sleeve of outer diameter just small enough to permit it being inserted into said housing, said sleeve having a length less than the distance from said shoulder to the open end of said housing, said sleeve having an open slot at one end, said one end thus being adapted to be inserted into said housing over said other cable, said open slot being rounded with a radius just sufficient to fit over the outer conductor of said other cable, the depth of said slot being not greater than the outside diameter of said outer conductor of said other cable, whereby said other cable is held in place against said shoulder when said cap is screwed in over said sleeve.

9. Parts as defined in claim 8 wherein said base has an outer diameter greater than the outer diameter of said cylindrical housing, thereby to permit said housing to be inserted into a hole in a conductive wall with that portion of the base extending out from said housing flat against said wall.

* * * * *